United States Patent

Kataoka et al.

[11] 4,023,196
[45] May 10, 1977

[54] NEGATIVE RESISTANCE ELEMENT COMPOSED OF A SEMICONDUCTOR ELEMENT

[75] Inventors: Shoei Kataoka; Hiroshi Tateno, both of Tanashi, Japan

[73] Assignee: Kogyo Gijutsuin, Japan

[22] Filed: Aug. 25, 1969

[21] Appl. No.: 852,550

[30] Foreign Application Priority Data

Aug. 27, 1968 Japan ............................ 43-60913

[52] U.S. Cl. .................................. 357/57; 357/1; 357/3

[51] Int. Cl.² ................. H01L 27/24; H01L 27/26; H01L 29/66

[58] Field of Search ............... 317/234, 235; 357/1, 357/3, 57

[56] References Cited

UNITED STATES PATENTS

| | | | |
|---|---|---|---|
| 3,365,583 | 1/1968 | Gunn ................................. | 317/234 |
| 3,466,563 | 9/1969 | Thim ................................. | 331/107 |
| 3,490,051 | 1/1970 | Hakki et al. ....................... | 331/107 |
| 3,600,705 | 8/1971 | Tantraporn ........................ | 317/234 |

FOREIGN PATENTS OR APPLICATIONS 6,700,620  7/1967  Netherlands ..................... 317/234

OTHER PUBLICATIONS

IEEE Transactions on Electron Devices, "Two-Port Microwave Amplification in Long Samples of Gallium Arsenide" by Robson et al., Sept. 1967, pp. 612–615.
IEEE Transactions on Electron Devices, "Microwave Phenomena in Bulk GaAs" by Hakki et al., Jan. 1966, pp. 94–105.
Bell Laboratories Record, "Bulk Effect Devices for Future Transmission Systems" by Engelbrecht, June 1967, pp. 192–197.

Primary Examiner—Edward J. Wojciechowicz

[57] ABSTRACT

An improved negative resistance element is disclosed, the element being composed of a semiconductor element and having an effective negative electroconductivity in a high electric field, the element being constructed so that the sectional area of the region near the anode is made larger than the sectional area of the other regions of the element, whereby the distribution of the high electric field in the interior of the element is made uniform along the element, that is, from the region near the anode toward the region near the cathode to thereby broaden the region having an effective negative resistance. Furthermore, and in an alternative embodiment, there is disclosed a negative resistance element in whch the region near the cathode besides the region near the anode is also made to have a larger sectional area than the other regions of the element.

16 Claims, 14 Drawing Figures

NEGATIVE RESISTANCE ELEMENT COMPOSED OF A SEMICONDUCTOR ELEMENT

BACKGROUND OF THE INVENTION

The present invention relates to improvements in a negative resistance element utilizing a semiconductor material such as GaAs having a negative electroconductivity in a high electric field.

More particularly, it is directed to enlarge the negative resistance region of such semiconductor material.

It has been found that a semiconductor material such as GaAs having two deep negative portions (valleys) within its electroconductive zone has such a property that, when a high electric field (over about 3 KV/cm for GaAs) is applied to the semiconductor material, the electron velocity is rather decreased. However, it is not always true that an element composed of the above-mentioned semiconductor material and ohmic electrodes attached thereto exhibits a voltage-current characteristic which is constantly negative in differentiation. Rather, it has been generally considered that such voltage-current characteristic does not show a negative differential resistivity.

It has been theoretically confirmed that, as the semiconductor elements of hitherto known types had a constant cross-sectional area, no negative resistance characteristic appears. The only fact known heretofore is that, when the product of the doping (impurity concentration) $n$ of the material constituting the semiconductive element and the distance $l$ between electrodes of the element is greater than a certain critical value such as, for GaAs, $10^{12} cm^{-2}$, a dipole domain 4 having a high electric field is produced in the element as shown in FIG. 3 and migrates from the cathode side toward the anode side, whereby a so-called Gunn-effect emerges to cause current oscillation due to gradual diminution and disappearance of the dipole domain thus produced. However, when $n$ is smaller than a certain critical value, e.g. $10^{12} cm^{-2}$ for GaAs, the dipole domain is not produced, with the result that the electric field distribution within the semiconductor element is strengthened in the anode region as shown in FIG. 4, so that the voltage-current characteristic of the element does not show any negative resistance characteristic.

As described above, since, in the relationship of $n\,l < 10^{12} cm^{-2}$ for GaAs, no dipole domain having a high electric field is produced, it has been attempted to amplify microwaves by the use of such element. In this case, however, as the electric field along the element becomes higher than its critical electric field, and the region showing negative electroconductivity is limited to only the region near the anode, the region capable of causing amplification is limited to such region having the negative electroconductivity. Accordingly, the element having the oscillation effect is not always effective for the purpose of amplification.

SUMMARY OF THE INVENTION

It is therefore a principal object of the invention to provide a semiconductor element having an effective amplification capability as well as oscillation capability without being accompanied by the disadvantage of the conventional semiconductor element.

The above object and other objects of the present invention have been attained by producing a uniform a high electric field in the interior of the semiconductive element by increasing the sectional area of the element toward the anode thereof.

The above objects and characteristic features of the invention will be clearly understood from the following description in connection with the accompanying drawing, in which the same or equivalent members are denoted by the same reference numerals.

BRIEF DESCRIPTION OF THE INVENTION

Figure 1:
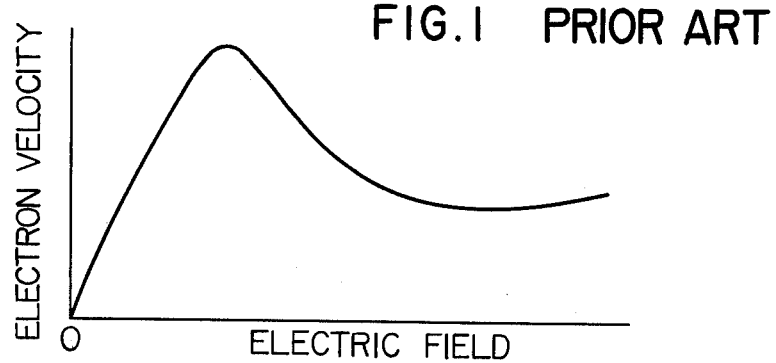
FIG. 1 is a characteristic curve showing the negative electroconductivity of a conventional semiconductor element.
Figure 2:
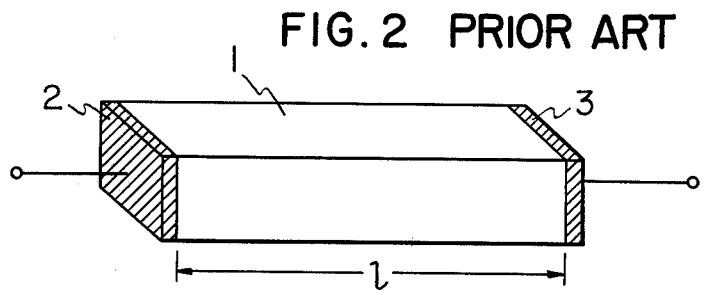
FIG. 2 is a perspective view showing a conventional semiconductor element.
Figure 3:
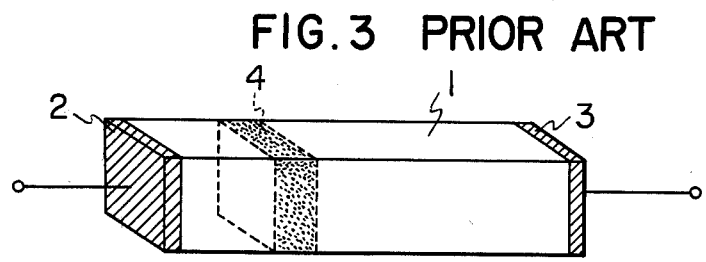
FIG. 3 is a perspective view showing another conventional semiconductor element.
Figure 4:
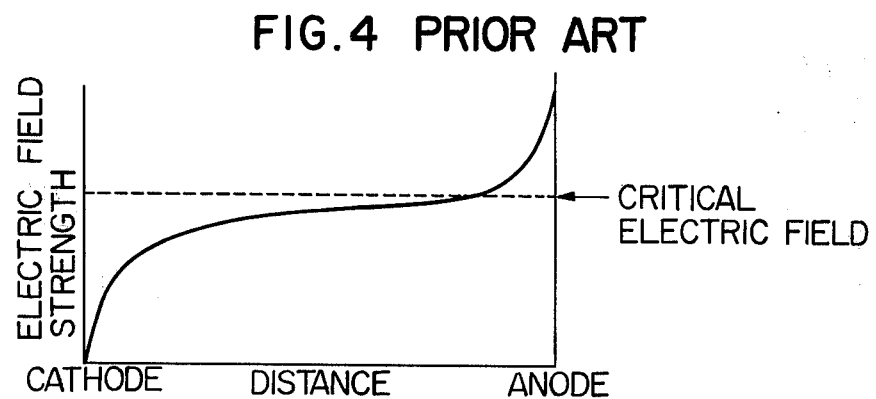
FIG. 4 is a characteristic curve showing the electric field distribution in the conventional semiconductor elements.
Figure 5A:
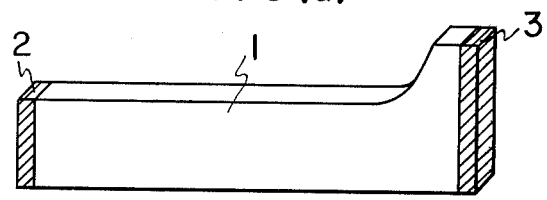
Figure 6:
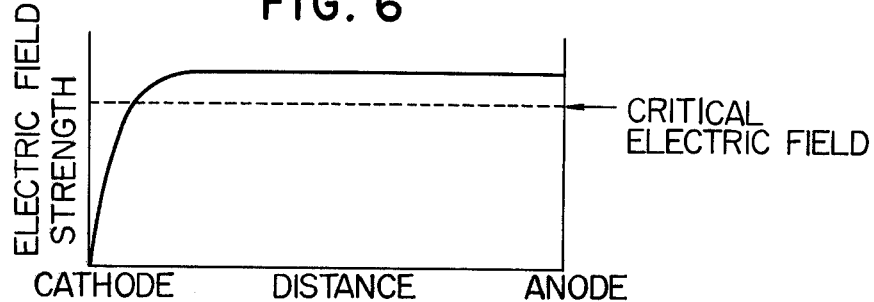
Figure 7A:
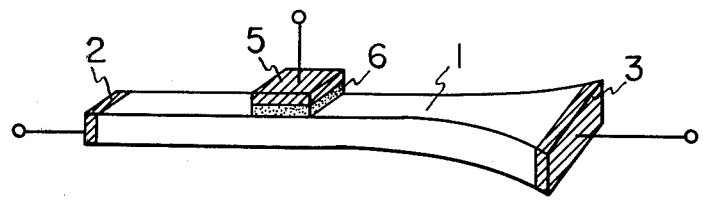
Figure 8A:
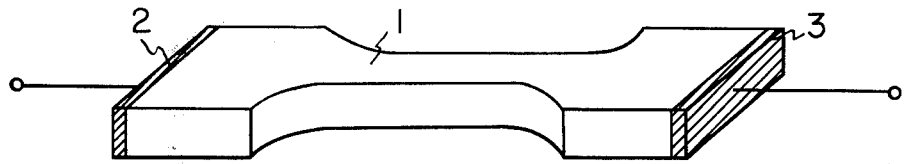
Figure 8B:
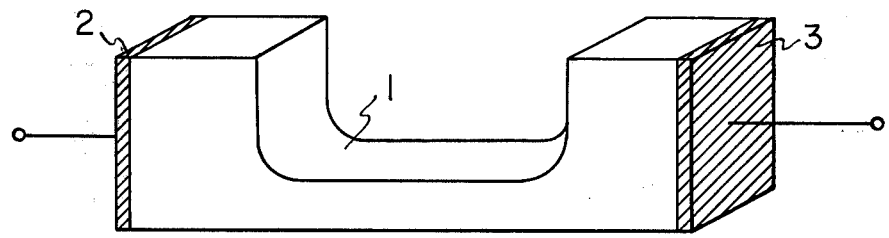

FIG. 5(a), (b), (c), (d) and (e) are perspective views of different examples of the semiconductor elements according to the present invention;

FIG. 6 is a characteristic curve showing the electric field distribution in the element according to the present invention;

FIGS. 7(a) and (b) are perspective views of different amplifiers in which the semiconductive elements according to the invention are used respectively; and FIGS. 8(a) and (b) are perspective views showing other examples of the semiconductor element according to the present invention.

DETAILED DESCRIPTION OF THE INVENTION

Referring to FIGS. 5(a), (b), (c), (d) and (e), the semiconductor element 1 has a configuration such that the sectional area of the region near the anode 3 is made to be larger than those of the other regions, for example, the region near the cathode 2. In these semiconductor elements, however, the electric field near the anode 3 is weakened due to the configuration thereof with the result that a electric field having uniform strength is produced throughout the interior of the element, whereby the region having an electric field larger than the critical electric field is broadened as shown in FIG. 6, causing establishment of remarkable negative resistance characteristic in the element.

Accordingly, if the elements as illustrated in FIGS. 5(a) to (e) are used for electric oscillation or amplification, improvement in performance of such function becomes possible.

FIG. 7(a) shows an embodiment of the present invention, in which the semiconductor element 1 of the above-described nature and configuration is provided on one part thereof with a control electrode 5 through an insulator 6. This control electrode causes, by its voltage, variations in distribution of electrical potential and electric field within the semiconductor body with the consequent change in the electrical characteristics appearing between the electrodes 2 and 3. For example, when a negative voltage is applied, a field effect occurs to reduce the cross-section of this portion, on account of which the electric field strength of the other portion is weakened and the negative resistance itself becomes accordingly smaller.

Figure 5B:
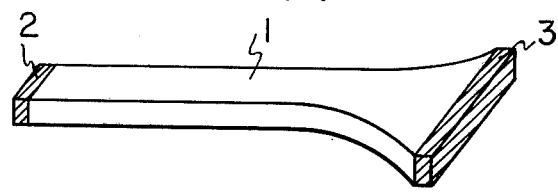
Figure 5C:
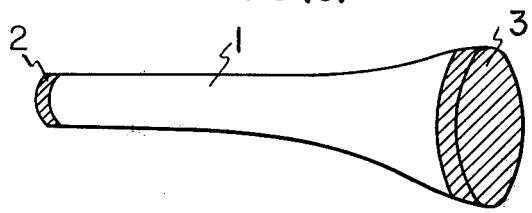
Figure 5D:
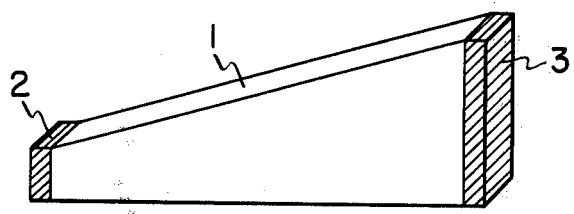
Figure 5E:
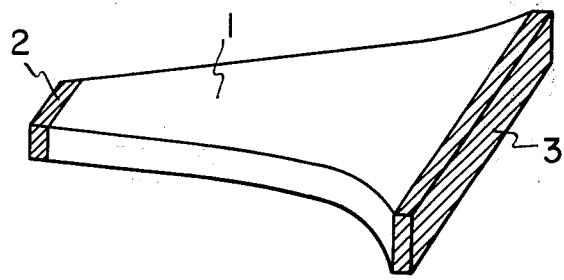
Figure 7B:
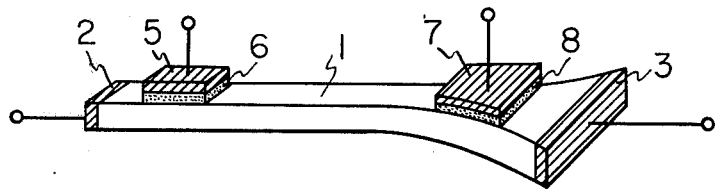

FIG. 7(b) also illustrates an example comprising the the semiconductor element 1 as illustrated in FIG. 5(b), ohmic electrodes 2 and 3 to which a d.c. voltage is applied, an input terminal 5 for applying a high frequency input power, and an output terminal 7, the terminals 5 and 7 being attached, through insulators 6 and 8, respectively, to the element 1, whereby amplification is possibly effected of a substantially entire region along the element 1.

Each of FIGS. 8(a) and (b) illustrates an example of the invention, in which the sectional area of the region near the cathode also is increased so that the increase of the negative resistance of the region near the anode may be also increased, while suppressing high electric field which is liable to occur in the domain near the cathode.

As described above, the invention relates to a semiconductor element such as GaAs having a negative electroconductivity in a high electric field, characterized by that distribution of the high electric field produced in the interior of the element is made uniform by enlarging the sectional area of the region near the anode to be connected with a positive terminal of d.c. voltage to be applied hereto, thereby to broaden the region having effective negative resistance.

Accordingly, it has become possible to improve remarkably the technical functions of amplification or oscillation semiconductor elements for use in super high frequency such as micro wave frequency.

We claim:

1. A negative resistance element comprising: a semiconductive body of GaAs showing a negative conductivity in a high electric field, and satisfying the relationship of $nl < 10^{12} cm^{-2}$ for GaAs, where $n$ is the impurity concentration in said body and $l$ is the distance between two ends of the body where electrodes are to be attached; and electrodes attached to the two ends of said semiconductive body, the cross-sectional area of said body near the anode being made larger than the smallest area in the remaining region of the body to obtain uniform electric field strength throughout the region.

2. The negative resistance element as defined in claim 1, wherein at least one control electrode is attached to the semiconductive body.

3. The negative resistance element as defined in claim 1, wherein an input electrode is attached to the semiconductive body.

4. The negative resistance element as defined in claim 1, wherein an output electrode is attached to the semiconductive body.

5. A solid state negative resistance device comprising an anode structure, a cathode structure, and an active body of bulk semiconductor material therebetween that microscopically exhibits the electron-transfer effect when biased with a selected electric field above the characteristic threshold electric field and has an $n_0 L$ product, where $n_0$ is the equilibrium charge carrier density and L is the length of the active semiconductor body, below the critical value needed to support Gunn oscillation, wherein the cross-sectional area of said active semiconductor body near the anode is made larger than the smallest cross-sectional area in the remaining part of the said active semiconductor body to maintain the selected electric field in the active semiconductor body at an approximately uniform value above the threshold electric field over the entire length of the active semiconductor body.

6. The negative resistance element as defined in claim 5, wherein at least one control electrode is attached to the semiconductive body.

7. The negative resistance element as defined in claim 5, wherein an input electrode is attached to the semiconductive body.

8. The negative resistance element as defined in claim 5, wherein an output electrode is attached to the semiconductive body.

9. A solid-state microwave amplifier device comprising an anode structure and a cathode structure and an active body of bulk semiconductor material therebetween that microscopically exhibits the electron-transfer effect when biased with a selected electric field above the characteristic threshold electric field and is uniformly subcritically doped with an $n_0 L$ product, where $n_0$ is the equilibrium charge carrier density and L is the length of the active semiconductor body, below the critical value needed to support Gunn oscillation, wherein
said cathode structure controls the injection of electrons into the active semiconductor body to a desired value to maintain the selected electric field in the active semiconductor body in the immediate vicinity of the cathode structure and over the remainder of the length of the active semiconductor body above the threshold electric field at a substantially uniform value, and said cathode structure further substantially maintains the equilibrium charge carrier density $n_0$ over most of the active semiconductor body.

10. A device as defined in claim 9, further characterized by being a diode having an active semiconductor body made of N-type gallium arsenide.

11. A device as defined in claim 9, wherein said cathode structure embodies means for effecting a space charge limitation of the injected current flow to a desired level to thereby limit the injection of electron charge carriers into the active semiconductor body.

12. A device as defined in claim 9, wherein said cathode structure embodies means for effecting current density compression of the injection current.

13. A solid state microwave amplifier circuit comprising a subcritically doped injection-current-limited electron-transfer effect device comprising at least an anode structure and a cathode structure and an active body of bulk semiconductor material therebetween having an $n_0 L$ product, where $n_0$ is the equilibrium charge carrier density and L is the length of the active semiconductor body, below the critical value needed to sustain Gunn oscillation, characterized by a cathode structure that controls the injection of charge carriers to a desired value to maintain the electric field in the active semiconductor body in the immediate vicinity of the cathode structure and over the remainder of the length of the active semiconductor body at an approximately uniform selected value above the threshold electric field, said cathode structure further substantially maintaining the equilibrium charge density $n_0$ over most of the active semiconductor body,
means for biasing said electron-transfer effect device with a unidirectional voltage that produces the selected above-threshold electric field,
means for applying to said electron-transfer effect device an electric signal to be amplified, and output means for receiving the amplified signal.

14. A solid-state negative resistance amplifier device comprising an anode structure, a cathode structure, and an active body of bulk semiconductor material therebetween that microscopically exhibits the electron-transfer effect when biased with a selected electric field above the characteristic threshold electric field and has an $n_0L$ product, where $n_0$ is the equilibrium charge carrier density and L is the length of the active semiconductor body, below the critical value needed to support Gunn oscillation, wherein said cathode structure controls the injection of charge carriers into the active semiconductor body to maintain the selected electric field in the active semiconductor body at an approximately uniform value above the threshold electric field in the immediate vicinity of said cathode structure and over the remainder of the length of the active semiconductor body.

15. A device as defined in claim 14, wherein said cathode structure comprises a metallic contact that is nonblocking to electron charge carriers and makes electrical connection to only a selected portion of the cathode area of the active semiconductor body.

16. A solid state negative resistance amplifier device comprising an anode structure, a cathode structure, and an active body of bulk semiconductor material therebetween that microscopically exhibits the electron-transfer effect when biased with a selected electric field above the characteristic threshold electric field and has an $n_0L$ product, where $n_0$ is the equilibrium charge carrier density and L is the length of the active semiconductor body, below the critical value needed to support Gunn oscillation, wherein said anode and cathode structures both comprise metallic contacts that are nonblocking to electron charge carriers, and said active semiconductor body is tapered so as to have a small cross-sectional area adjacent said cathode structure and a large cross-sectional area adjacent said anode structure in order to control the injection of charge carriers into the active semiconductor body to maintain the selected electric field in the active semiconductor body at an approximately uniform value above the threshold electric field in the vicinity of said cathode structure and over the entire remainder of the length of the active semiconductor body.

* * * * *